(12) United States Patent
Im

(10) Patent No.: US 8,012,833 B2
(45) Date of Patent: Sep. 6, 2011

(54) SEMICONDUCTOR DEVICE AND METHOD OF FABRICATING THE SAME

(75) Inventor: Song Hyeuk Im, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 753 days.

(21) Appl. No.: 11/966,421

(22) Filed: Dec. 28, 2007

(65) Prior Publication Data

US 2009/0072344 A1    Mar. 19, 2009

(30) Foreign Application Priority Data

Sep. 17, 2007 (KR) .................. 10-2007-0094059

(51) Int. Cl.
*H01L 21/336* (2006.01)
(52) U.S. Cl. ............... 438/270; 438/226; 257/E21.561
(58) Field of Classification Search .................. 438/226, 438/269, 270, 297, 413, 442; 257/347, E21.561, 257/E21.564, E21.566
See application file for complete search history.

(56) References Cited

U.S. PATENT DOCUMENTS

| 6,218,217 | B1 * | 4/2001 | Uenishi et al. | 438/138 |
|---|---|---|---|---|
| 6,528,853 | B2 * | 3/2003 | Christensen et al. | 257/353 |
| 6,847,079 | B2 * | 1/2005 | Nakamura | 257/330 |
| 7,601,582 | B2 * | 10/2009 | Im | 438/226 |
| 2007/0007571 | A1 * | 1/2007 | Lindsay et al. | 257/306 |
| 2010/0019315 | A1 * | 1/2010 | Im | 257/330 |

FOREIGN PATENT DOCUMENTS

KR    10-1997-0077490    12/1997
KR    100702315 B1    3/2007

* cited by examiner

*Primary Examiner* — Ken A Parker
*Assistant Examiner* — Jose R Diaz
(74) *Attorney, Agent, or Firm* — Kilpatrick Townsend & Stockton LLP

(57) ABSTRACT

A method for fabricating a semiconductor device includes forming an insulating pattern over a semiconductor substrate. An epitaxial growth layer is formed over the semiconductor substrate exposed by the insulating pattern to fill the insulating pattern with the epitaxial growth layer. A recess gate having a recess channel is formed. The recess channel is disposed between two neighboring insulating patterns.

12 Claims, 4 Drawing Sheets

SEMICONDUCTOR DEVICE AND METHOD OF FABRICATING THE SAME

CROSS-REFERENCES TO RELATED APPLICATIONS

This application claims priority of Korean patent application number 10-2007-0094059, filed on Sep. 17, 2007, which is incorporated by reference in its entirety.

BACKGROUND OF THE INVENTION

The present invention relates to a semiconductor device. More particularly, the present invention relates to a semiconductor device having a recess transistor.

As a semiconductor device becomes smaller and more highly integrated, a technology for reducing the size of semiconductor devices has been required. Due to the trends in miniaturization and integration of semiconductor devices, the design rule of the devices is reduced so that a channel length of a metal oxide semiconductor field effect transistor (MOSFET) is decreased.

Since the reduced channel length decreases a distance between a source region and a drain region, there is a difficulty to control of a short channel effect (SCE) where a voltage of the drain region affects voltages of the source region and the channel region. As a result, active switch elements are degraded. The narrow gap between the source region and the drain region causes a punch-through phenomenon between a source region and a drain region.

In order to prevent the punch-through phenomenon, the gate is formed by recessing the semiconductor substrate and filling it with a gate electrode, thereby increasing an effective channel length. This structure is called a recessed field effect transistor (FET) structure. The recessed FET structure improves the punch-through phenomenon, and increases a gap between the source region and the drain region.

However, a recessed gate is weak in controlling degradation of a threshold voltage Vt, thereby lowering a threshold voltage and generating a leakage current in a transistor Off state. In order to control the degradation of the threshold voltage, it is necessary to add an additional ion implanting process with impurities such as Boron. The additional ion implanting process increases an electric field, thereby degrading a refresh characteristic.

Since the semiconductor substrate is etched at a relatively deep level to form the recess gate, the swing characteristic as well as the gate controllability is degraded due to an increased body effect. Moreover, the device characteristic is degraded by the neighboring gate effect of the recess gates.

SUMMARY OF THE INVENTION

Embodiments of the invention are directed to a semiconductor device including a recess transistor. According to an embodiment of the invention, the recess transistor includes an insulating film having a bird's beak profile formed by a LOCOS method in a semiconductor substrate of a junction region, an epitaxial growth layer over the semiconductor substrate as a seed layer to fill the insulating film. The semiconductor device improves short channel effects such as a punch-through and a drain induced barrier lowering (DIBL), and prevents a device characteristic from being degraded due to a body effect.

According to an embodiment of the invention, a semiconductor device includes: a recess gate formed over a semiconductor substrate, and an insulating pattern disposed in the semiconductor substrate between two neighboring recess gates. The insulating pattern is separated from a channel of the recess gate by a given distance.

According to an embodiment of the invention, a method of fabricating a semiconductor device includes: forming an insulating pattern over a semiconductor substrate; forming an epitaxial growth layer over the semiconductor substrate exposed by the insulating pattern to fill the insulating pattern with the epitaxial growth layer; and forming a recess gate having a recess channel disposed between two neighboring insulating patterns.

DESCRIPTION OF EMBODIMENTS

The present invention relates to a semiconductor device including a recessed transistor. In one embodiment of the invention, the recessed transistor includes an insulating pattern disposed in a semiconductor substrate between recessed gates. The insulating pattern is separated from a channel of the recessed gates by a given distance.

In the invention, a recessed gate is formed using the methods of forming an insulating pattern and an epitaxial growth layer. The insulating pattern is formed by a Localized Oxidation of Silicon (LOCOS) method, which was used to form a device isolation structure. For example, an insulating pattern having a Bird's beak profile is formed using the LOCOS method at both ends of a semiconductor substrate where a junction region is to be formed. An epitaxial growth layer is then formed over the exposed semiconductor substrate between the insulating patterns to fill the insulating pattern.

A device isolation structure is formed by a shallow trench isolation (STI) method over the semiconductor substrate including the insulating pattern. A recessed gate is then formed over the semiconductor substrate including the device isolation structure. The insulating pattern having a bird's beak serves as a barrier for breaking an interaction between neighboring gates. The insulating pattern also serves as a barrier for shielding the body effect. A distance between the insulating pattern and the recess gate is formed with a substantial channel depth, thereby preventing degradation of a threshold voltage.

FIGS. 1a to 1g are cross-sectional views illustrating a method of fabricating a semiconductor device according to an embodiment of the invention. A mask layer 110 is formed over a semiconductor substrate 100. A photoresist film (not shown) is coated over mask layer 110. The photoresist film is exposed and developed to form a photoresist pattern 120 that exposes a junction region to be formed. Mask layer 110 includes a nitride film to have a thickness in the range of about 500 Å to about 1,000 Å.

Figure 1A:
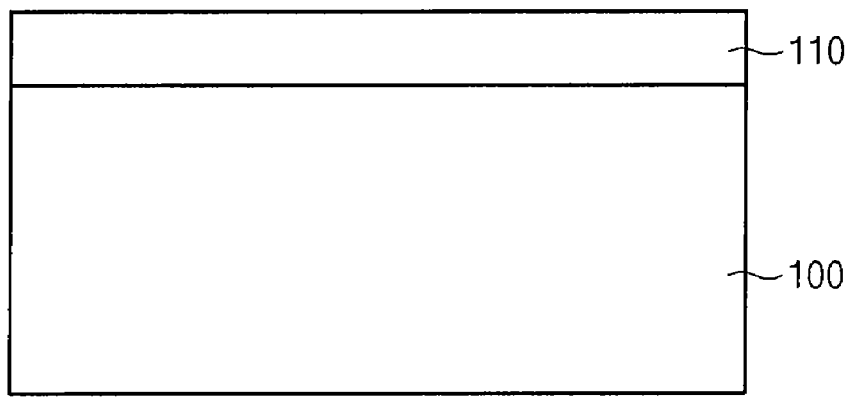
FIGS. 1a to 1g are cross-sectional views illustrating a method for fabricating a semiconductor device according to an embodiment of the present invention.
Figure 1B:
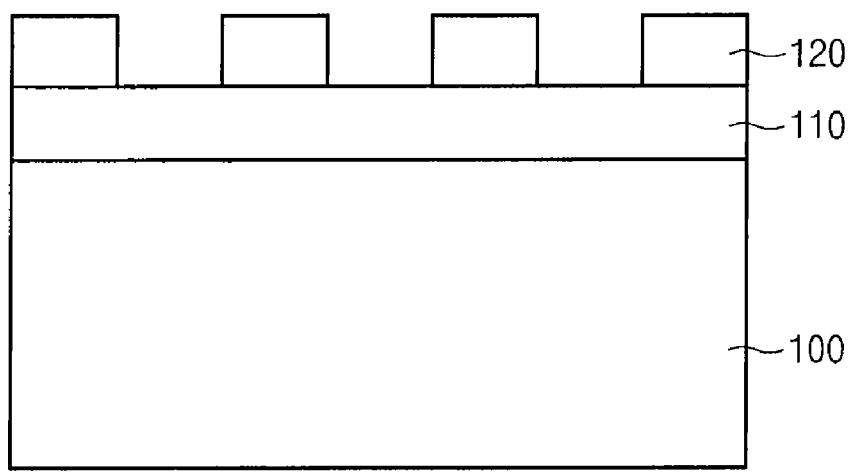
Figure 1C:
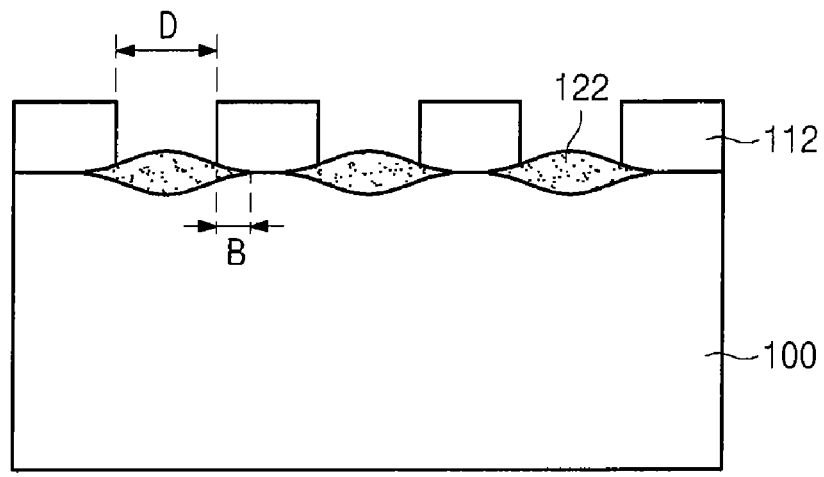

Referring to FIG. 1c, mask layer 110 is etched using photoresist pattern 120 as a mask to form a mask pattern 112 that exposes semiconductor substrate 100 where the junction region is to be formed. Photoresist pattern 120 is then removed. An insulating pattern 122 having a bird's beak profile is formed in semiconductor substrate 100 exposed between mask patterns 112.

Insulating pattern 122 having a bird's beak profile includes an oxide film. Insulating pattern 122 is formed by a LOCOS method. The LOCOS method is performed by a thermal treatment at a temperature in the range of about 900° C. to about 1000° C. The thermal treatment is performed for a substantial time (e.g., at least about 1 hour) to obtain the bird's beak profile. The bird's beak profile is formed at both sides of insulating pattern 122 over the exposed semiconductor substrate 100.

The size B of the bird's beak profile formed at one side of insulating pattern 122 may be adjusted to at most a half of the width D of semiconductor substrate 100 exposed between two neighboring mask patterns 112. The bird's beak profile may be controlled not to be bridged with that of insulating pattern 122.

Figure 1D:
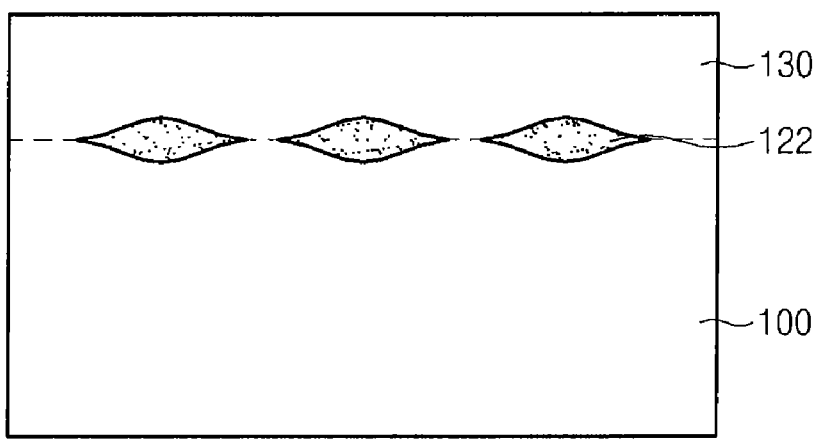

Referring to FIG. 1d, mask pattern 112 is removed to expose semiconductor substrate 100 including insulating pattern 122. An epitaxial growth layer 130 is formed over semiconductor substrate 100 exposed between insulating patterns 122 as a seed layer, thereby covering insulating pattern 122 having a bird's beak profile.

Mask pattern 112 is removed using a high thermal $H_2PO_4$. Epitaxial growth layer 130 is formed at a temperature in the range of about 700° C. to about 900° C. Epitaxial growth layer 130 may be adjusted depending upon depths (or thicknesses) of the recess gate and the recess channel. Epitaxial growth layer 130 has a thickness in the range of about 600 Å to about 1,600 Å.

Figure 1E:
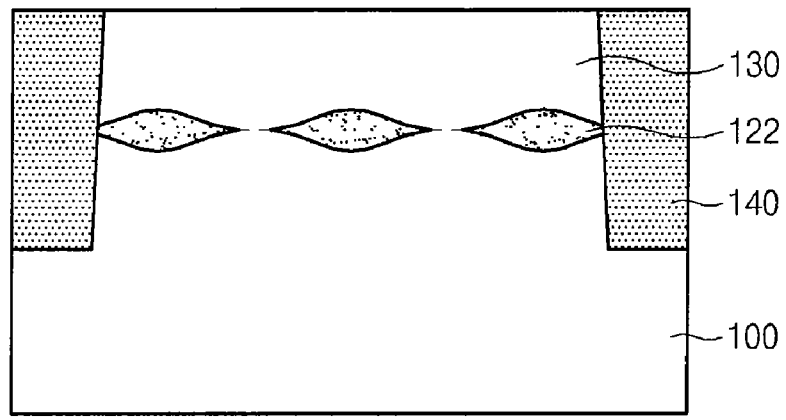

Referring to FIG. 1e, a trench (not shown) for device isolation is formed by a STI method over semiconductor substrate 100 including epitaxial growth layer 130 that covers insulating pattern 122 having a bird's beak profile. An insulating film for device isolation (not shown) is formed to fill the trench. The insulating film for device isolation is etched to expose epitaxial growth layer 130 to form a device isolation structure 140 that defines an active region.

Insulating pattern 122 having a Bird's beak profile may be short-circuited with device isolation structure 140 next to insulating pattern 122. However, the short improves characteristics of the device. For example, this short improves a device isolation characteristic and reduces a body effect.

Figure 1F:
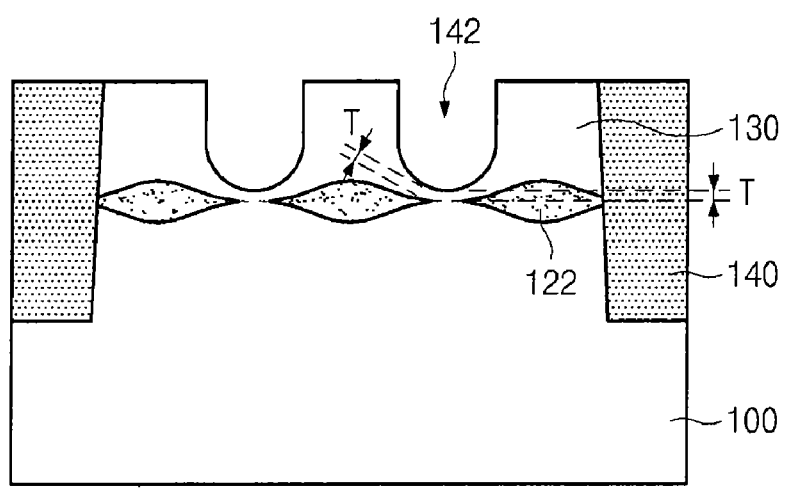
Figure 1G:
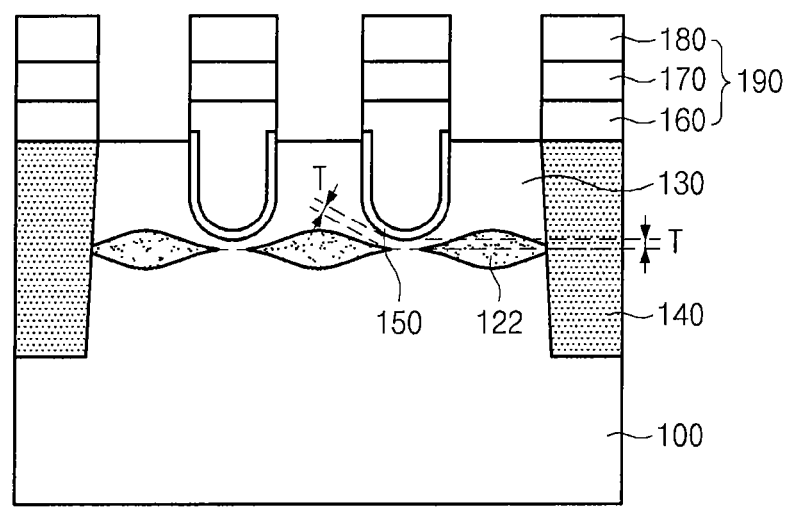

Referring to FIGS. 1f and 1g, semiconductor substrate 100 including epitaxial growth layer 130 is etched to form a recess 142. A gate insulting film 150 is formed over semiconductor substrate 100 including recess 142. A gate conductive layer (not shown) is formed to fill the recess 142. A gate hard mask layer (not shown) is formed over the gate conductive layer. The gate hard mask layer and the gate conductive layer are patterned using a gate mask (not shown) to form a recess gate 190 including a stacked structure having a lower gate electrode 160, an upper gate electrode 170 and a gate hard mask layer 180.

Insulating pattern 122 is separated from the lower portion of recess 142 by a channel depth of recess gate 190. The separation depth T ranges from about 50 Å to about 150 Å. Recess gate 190 formed over recess 142 is separated from insulating pattern 122 by a channel depth so as to control a punch-through phenomenon. As a result, an additional ion implanting process for improving a threshold voltage Vt may be skipped, thereby improving a refresh characteristic of the device.

Lower gate electrode 160 includes one layer selected from the group consisting of a polysilicon layer, a SiGe layer, and a combination thereof. Upper gate electrode 170 includes one layer selected from the group consisting of a titanium nitride film, a tungsten nitride film, a tungsten polyside layer, a titanium polyside layer, a titanium layer, a tungsten layer, and combinations thereof.

As described above, a semiconductor device and a method of fabricating the same in one embodiment of the invention can embody a recess transistor including an insulating film having a bird's beak profile, thereby improving electric characteristics of the device such as a punch-through phenomenon, a body effect, and a neighboring gate effect. As a result, a refresh characteristic of the device can be improved.

For example, an insulating film having a Bird's beak profile is separated from a recess gate by a channel depth to control a punch-through phenomenon that causes a leakage of a threshold voltage. The insulating film serves as a barrier that breaks the body effect generated in the recess gate to control the body effect. The insulating film also serves as a barrier that shields interaction between adjacent gates to control the neighboring gate effect.

Due to control in the punch-through phenomenon, the body effect and the neighboring gate effect, a gate control capability may be improved, thereby improving a swing characteristic of the device. An additional ion implanting process for preventing degradation of the threshold voltage may be skipped to improve an electric field, thereby improving a refresh characteristic of the device.

The above embodiments of the present invention are illustrative and not limitative. Various alternatives and equivalents are possible. The invention is not limited by the lithography steps described herein. Nor is the invention limited to any specific type of semiconductor device. For example, the present invention may be implemented in a dynamic random access memory (DRAM) device or a non-volatile memory device. Other additions, subtractions, or modifications are obvious in view of the present disclosure and are intended to fall within the scope of the appended claims.

What is claimed is:

1. A method for fabricating a semiconductor device, the method comprising:
    forming an insulating pattern over a semiconductor substrate, the insulating pattern exposing portions of the semiconductor substrate;
    growing an epitaxial layer using the exposed portions of the semiconductor substrate, the epitxial layer covering the insulating pattern; and
    forming a recess gate having a recess channel, the recess channel disposed between two neighboring insulating patterns and a part pf the insulating pattern overlapping the recess gate.

2. The method of claim 1, wherein the process of forming the insulating pattern comprises:
    forming a mask pattern over the semiconductor substrate, the mask pattern exposing portions of the semiconductor substrate; and
    forming the insulating pattern having a bird's beak profile over the portions of the semiconductor substrate that are exposed by the mask pattern.

3. The method of claim 2, wherein the mask pattern comprises a nitride film having a thickness in the range of about 500 Å to about 1,000 Å.

4. The method of claim 2, wherein a size of the insulating pattern overlapping the recess gate is no more than a half of that of the recess gate.

5. The method of claim 1, wherein the insulating pattern comprises an oxide film formed by a LOCOS method.

6. The method of claim 5, wherein the oxide film is formed by a thermal treatment performed at a temperature in the range of about 900° C. to about 1,100° C.

7. The method of claim 1, wherein the epitaxial growth layer is formed at a temperature in the range of about 700° C. to about 900° C.

8. The method of claim 1, wherein a thickness of the epitaxial layer is adjusted by a depth of the recess gate and a depth of the recess channel.

9. The method of claim 8, wherein the epitaxial layer is formed to have a thickness in the range of about 700 Å to about 1,600 Å.

10. The method of claim 1, wherein the insulating pattern is separated from a bottom of the recess gate by a thickness of a channel.

11. The method of claim 10, wherein the channel is formed to have a thickness in the range of about 50 Å to about 150 Å.

12. The method of claim 1, further comprising forming a device isolation structure over the semiconductor substrate to define an active region.

* * * * *